(12) United States Patent
Ikari et al.

(10) Patent No.: US 11,348,764 B2
(45) Date of Patent: May 31, 2022

(54) ELECTRODE RING

(71) Applicant: THINKON NEW TECHNOLOGY JAPAN CORPORATION, Tokyo (JP)

(72) Inventors: Atsushi Ikari, Shunan (JP); Satoshi Fujii, Tokyo (JP)

(73) Assignee: THINKON NEW TECHNOLOGY JAPAN CORPORATION, Tokyo (JP)

( * ) Notice: Subject to any disclaimer, the term of this patent is extended or adjusted under 35 U.S.C. 154(b) by 105 days.

(21) Appl. No.: 16/488,384

(22) PCT Filed: Feb. 16, 2018

(86) PCT No.: PCT/JP2018/005499
§ 371 (c)(1),
(2) Date: Aug. 23, 2019

(87) PCT Pub. No.: WO2018/155337
PCT Pub. Date: Aug. 30, 2018

(65) Prior Publication Data
US 2020/0194237 A1 Jun. 18, 2020

(30) Foreign Application Priority Data
Feb. 23, 2017 (JP) .............................. JP2017-032598

(51) Int. Cl.
*H01J 37/32* (2006.01)
(52) U.S. Cl.
CPC .. *H01J 37/32541* (2013.01); *H01J 37/32642* (2013.01)

(58) Field of Classification Search
CPC ............. H01J 37/32541; H01J 37/3255; H01J 37/32642; H01L 21/3065; H05H 1/46
See application file for complete search history.

(56) References Cited

U.S. PATENT DOCUMENTS

| 9,187,827 | B2* | 11/2015 | Furuta | ............... | H01J 37/32559 |
| 9,916,994 | B2* | 3/2018 | Cuvalci | ............. | H01L 21/68785 |
| 2004/0266158 | A1* | 12/2004 | Boyle | ............... | H01L 21/67306 |
| | | | | | 438/612 |
| 2007/0188731 | A1* | 8/2007 | Bezama | .................. | G03F 7/707 |
| | | | | | 355/72 |

(Continued)

FOREIGN PATENT DOCUMENTS

JP 2002-190466 7/2002
JP 2004296553 A * 10/2004
(Continued)

OTHER PUBLICATIONS

International Search Report dated May 22, 2018 in International Application No. PCT/JP2018/005499.

*Primary Examiner* — Benjamin Kendall
(74) *Attorney, Agent, or Firm* — Wentsler LLC (57) ABSTRACT

Provided is a ring for an electrode in which a plurality of silicon members is joined. The ring for the electrode includes a plurality of first silicon members abutted in one direction, an embedded silicon member that is embedded at a position across the plurality of first silicon members abutted, and a joining part joining the plurality of first silicon members and the embedded silicon member, the joining part provided between the plurality of first silicon members and the embedded silicon member.

12 Claims, 7 Drawing Sheets

(56) References Cited

U.S. PATENT DOCUMENTS

| | | | |
|---|---|---|---|
| 2009/0294064 A1* | 12/2009 | Nagayama | H01J 37/32623 156/345.39 |
| 2010/0116436 A1* | 5/2010 | Kitajima | H01J 37/3255 156/345.1 |
| 2011/0049100 A1* | 3/2011 | Han | H01L 21/68785 216/67 |
| 2015/0243488 A1 | 8/2015 | Kubota et al. | |
| 2017/0056994 A1* | 3/2017 | Joslin | B23K 35/24 |
| 2019/0390912 A1* | 12/2019 | Muneishi | F28F 9/0268 |

FOREIGN PATENT DOCUMENTS

| | | | |
|---|---|---|---|
| JP | 2008300425 A | * | 1/2008 |
| JP | 2010-114313 | | 5/2010 |
| JP | 2011-3730 | | 1/2011 |
| JP | 2014094855 A | * | 5/2014 |
| JP | 2015-65024 | | 4/2015 |
| JP | 2015-159202 | | 9/2015 |

* cited by examiner

ELECTRODE RING

TECHNICAL FIELD

The present invention relates to a ring for an electrode.

BACKGROUND ART

A dry etching apparatus using plasma is used as a substrate treatment apparatus in manufacture of a semiconductor integrated device such as an LSI. In the dry etching apparatus, while a wafer to be etched is placed on a cathode of a planar electrode and etching gas is introduced into the apparatus, a high-frequency voltage is applied between the cathode and a counter electrode (anode) by a high-frequency oscillator to generate plasma of the etching gas between the electrodes. Positive ions as activated gas in the plasma enter a surface of the wafer to etch the wafer.

A metal component causes metal contamination when it is used inside the dry etching apparatus, and therefore, a silicon component is used. Representative examples of the silicon component include a focus ring that has a doughnut shape surrounding the wafer to be etched (Patent Literature 1). It is necessary for the focus ring to have a diameter larger than that of the wafer to be etched. A silicon component for 300 mm wafer, which is mainly in current use, is expensive because the silicon component is fabricated from a silicon crystal ingot having a diameter of 320 mm or more.

CITATION LIST

Patent Literature

Patent Literature 1: Japanese Patent Laid-Open No. 2002-190466

SUMMARY OF INVENTION

Technical Problem

If the silicon component can be manufactured by joining a plurality of silicon members, not from a one-piece component, silicon crystal ingots that have a smaller diameter can be used for fabrication of the silicon component. Therefore, various advantages such as manufacturing cost reduction are expected.

An object of the present invention is to provide a ring for an electrode in which a plurality of silicon members are joined together.

Solution to Problem

A ring for an electrode according to the present invention is a ring for an electrode to be installed in a treatment chamber of a substrate treatment apparatus performing plasma treatment on a substrate, and the substrate is accommodated in the treatment chamber. The ring for the electrode includes a plurality of first silicon members abutted in one direction, an embedded silicon member that is embedded at a position across the plurality of first silicon members abutted, and a joining part joining the plurality of first silicon members and the embedded silicon member, the joining part provided between the plurality of first silicon members and the embedded silicon member.

A ring for an electrode according to the present invention is a ring for an electrode to be installed in a treatment chamber of a substrate treatment apparatus performing plasma treatment on a substrate, and the substrate is accommodated in the treatment chamber. The ring for the electrode includes a plurality of silicon members, a joining part joining the plurality of silicon members, and a silicon adhesion part plugging a gap between the plurality of silicon members.

Advantageous Effects of Invention

According to the present invention, it is possible to manufacture the ring for the electrode by combining a plurality of silicon members each cut out from a wafer that has a size smaller than an outer diameter of a focus ring. Accordingly, for the ring for the electrode, it is unnecessary to use the wafer that has a size larger than the outer diameter of the focus ring, and accordingly the cost can be reduced.

BRIEF DESCRIPTION OF DRAWINGS

FIG. 6A is a cross-sectional view illustrating an abutting surface according to a second embodiment, where FIG. 6A illustrates an abutting surface of a first silicon member.

FIG. 6B illustrates an abutting surface of a second silicon member.

FIG. 7A is a perspective view illustrating a ring for an electrode according to a third embodiment, where FIG. 7A illustrates top surface side.

FIG. 7B is a perspective view illustrating a ring for an electrode according to a third embodiment, where FIG. 7B illustrates bottom surface side.

FIG. 9A illustrates a modification.

FIG. 9B illustrates a modification (2).

FIG. 10A illustrates a modification (1).

FIG. 10B illustrates a modification (2).

DESCRIPTION OF EMBODIMENT

An embodiment of the present invention is described in detail below with reference to drawings.

1. First Embodiment (1) Overall Configuration

Figure 1:
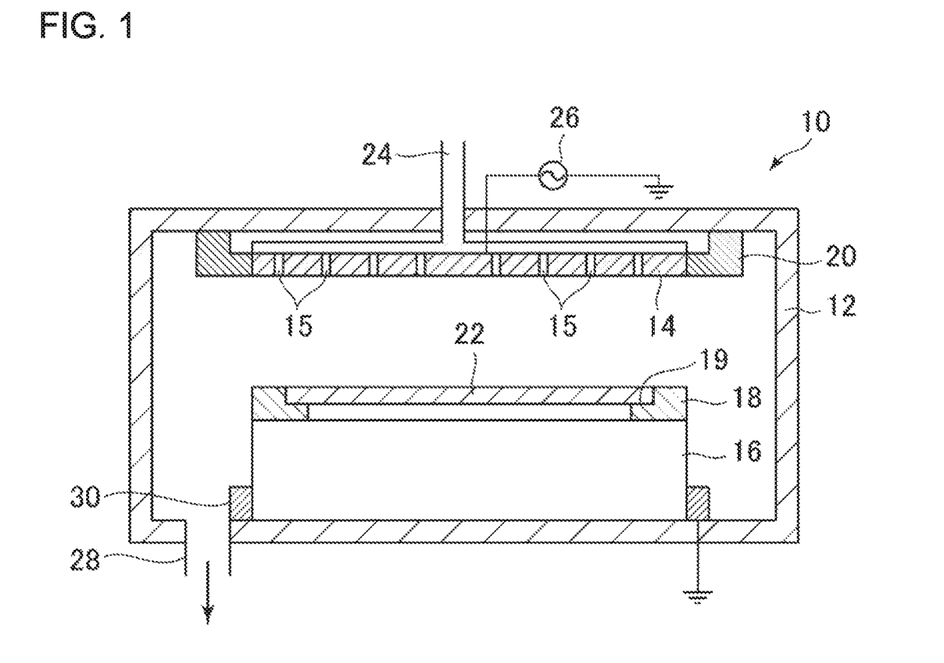
FIG. 1 is a cross-sectional view schematically illustrating a configuration of a dry etching apparatus that includes a focus ring fabricated from a ring for an electrode according to a first embodiment.

A dry etching apparatus 10 illustrated in FIG. 1 includes a vacuum chamber 12 as a treatment chamber, an upper electrode plate 14, a base 16, and a focus ring 18. The upper electrode plate 14 is a disc-like member, and is fixed to an upper part inside the vacuum chamber 12 by a support ring 20. The support ring 20 is made of silicon as an insulating member. The upper electrode plate 14 includes a plurality of through holes 15 each penetrating through the upper electrode plate 14 in a thickness direction. The upper electrode plate 14 is electrically connected with a high-frequency power supply 26. The upper electrode plate 14 is connected with a gas supply pipe 24. Etching gas supplied through the gas supply pipe 24 may flow into the vacuum chamber 12 from the through holes 15 of the upper electrode plate 14, and may be exhausted to outside from an exhaust port 28.

The base 16 is disposed at a lower part inside the vacuum chamber 12 and is surrounded by a ground ring 30. The ground ring 30 is made of silicon as an insulating member, and is grounded. The focus ring 18 is provided on the base 16. The focus ring 18 is made of silicon as an insulating member, and a concave part 19 supporting a peripheral edge of a wafer 22 as a substrate is provided over an entire inner circumference.

The dry etching apparatus 10 is supplied with the etching gas through the upper electrode plate 14. When the high-frequency voltage is applied from the high-frequency power supply 26, plasma is generated between the upper electrode plate 14 and the wafer 22. The surface of the wafer 22 is etched by this plasma.

The ring for the electrode according to the present embodiment is applicable to the focus ring 18, the support ring 20, and the ground ring 30 described above. The ring for the electrode is not limited to the focus ring 18, the support ring 20, and the ground ring 30 described above. The ring for the electrode is applicable to a silicon member that is placed inside the vacuum chamber 12 of the dry etching apparatus 10 and is supplied with the voltage or is grounded.

Figure 2:
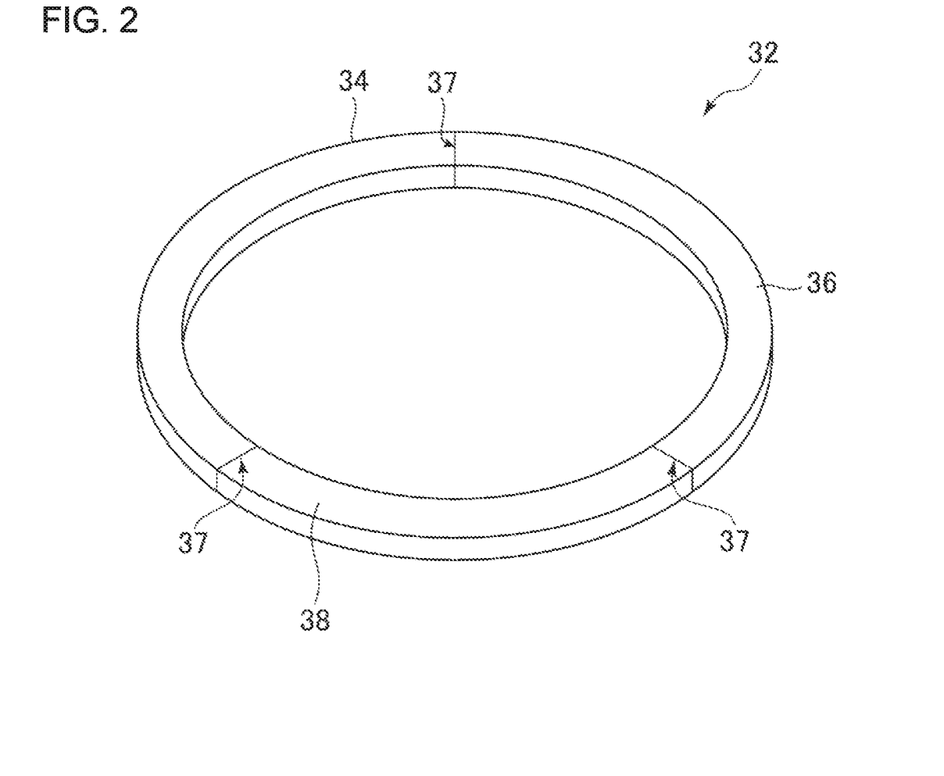
FIG. 2 is a perspective view illustrating the ring for the electrode according to a first embodiment.

The ring for the electrode according to the present embodiment that serves as the member of the focus ring 18 is described with reference to FIG. 2. A ring 32 for an electrode includes a plurality of (three in this figure) first silicon members 34, 36, and 38. Note that, in the following description, in a case where the plurality of first silicon members 34, 36, and 38 is not particularly distinguished from one another, these are collectively referred to as silicon members. The silicon members each have an arc shape, and are integrated in a ring shape by joining abutting surfaces 37 that are end faces of the silicon members in a longitudinal direction, in one direction through joining parts (not illustrated in the figure). The silicon members each may contain monocrystalline silicon or polycrystalline silicon, and a manufacturing method, purity, crystal orientation, etc. thereof are not limited. Although a size of each of the silicon members is not particularly limited, each of the silicon members has, for example, a thickness of about 1 mm or more and about 50 mm or less, and a width of about 10 mm or more and about 100 mm or less.

Figure 3:
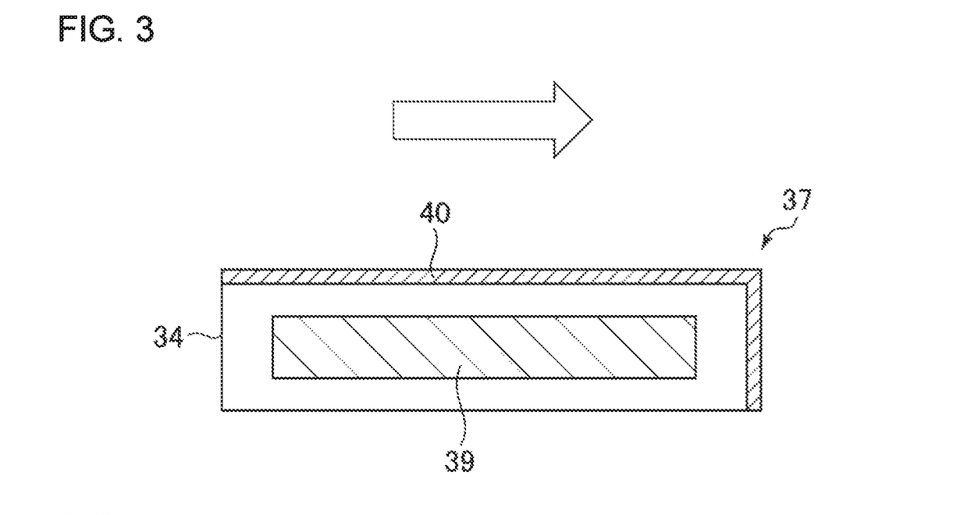
FIG. 3 is a cross-sectional view illustrating an abutting surface according to a first embodiment.

As illustrated in FIG. 3, a joining part 39 and a silicon bonding part 40 are provided between the abutting surfaces 37 of the silicon members. FIG. 3 illustrates the abutting surface 37 of the first silicon member between the first silicon members 34 and 36. A direction of an arrow in the figure indicates an outside direction in a radial direction of the ring 32 for the electrode.

Each of the joining parts 39 is provided at a center part except for a range of several mm from outer edges of the abutting surfaces 37, and is preferably provided at the center part except for a range of 1 mm or more. The joining part 39 is made of a eutectic alloy of silicon and silicon containing a metal forming a eutectic alloy with silicon. The metal forming a eutectic alloy with silicon is any one of Al, Ga, Ge, and Sn (hereinafter, also referred to as "alloying metal"). The metals Al, Ga, Ge, and Sn are preferable because each of the metals has a low diffusion coefficient in silicon crystal and is little diffused in a silicon member, hardly forms a deep level that becomes an electric problem, and has no influence on environment. The most preferable metal is Al because of low price. The purity of the alloying metal is not particularly limited as long as the alloying metal can form a eutectic with silicon, and the purity of the alloying metal is preferably 98% or more.

Each of the silicon adhesion parts 40 is provided on the outer edges of the abutting surfaces 37, and plugs the gap between the abutting surfaces 37. The silicon bonding parts 40 are preferably provided at parts that are not in contact with the wafer 22 and the base 16, are exposed inside the vacuum chamber 12, and are to be irradiated with plasma in dry etching, namely, on the top surface side of the ring 32 for the electrode out of the outer edges of the abutting surfaces 37. Further, the silicon adhesion parts 40 are more preferably provided also on outer peripheral surface side out of the outer edges of the abutting surfaces 37, in addition to the top surface side. Each of the silicon adhesion parts 40 plugs the gap between the abutting surfaces 37 to be irradiated with plasma, thereby preventing the eutectic alloy at the joining part 39 from being exposed.

(2) Manufacturing Method

Next, a method of manufacturing the ring 32 for the electrode is described. First, surface treatment is performed on the silicon members. More specifically, surfaces of the respective silicon members are treated by grinding, polishing, or the like, to preferably form mirror surfaces. The surfaces of the respective silicon members may be etched by mixed solution of hydrofluoric acid and nitric acid. As the mixed solution, chemical polishing solution (hydrofluoric acid (49%):nitric acid (70%):acetic acid (100%)=3:5:3) standardized as JIS H 0609 may be used.

Subsequently, the three first silicon members 34, 36 and 38 are arranged in the ring shape. An alloying metal foil is disposed between the abutting surfaces 37 of the first silicon members 34, 36 and 38. A thickness of the alloying metal foil is preferably small in terms of reduction in energy for melting. The thickness of the alloying metal foil is preferably 0.1 µm to 100 µm, and more preferably 0.5 µm to 20 µm to exert joining strength. If the thickness of the alloying metal foil is lower than the above-described lower limit value, the alloying metal foil is easily damaged when disposed on the joining surface. If the thickness of the alloying metal foil is larger than the above-described upper limit value, a part where joining with silicon is insufficient is easily generated.

Next, heating is performed from the outer side of the silicon members, to generate a melt containing silicon and the alloying metal. The heating method is not particularly limited, and the heating can be performed through resistance heating, optical heating, etc. The optical heating is preferable because positions to be heated can be easily shifted, and a heating amount can be easily changed based on the supplied power. For example, various kinds of lamps and lasers are used.

Figure 4:
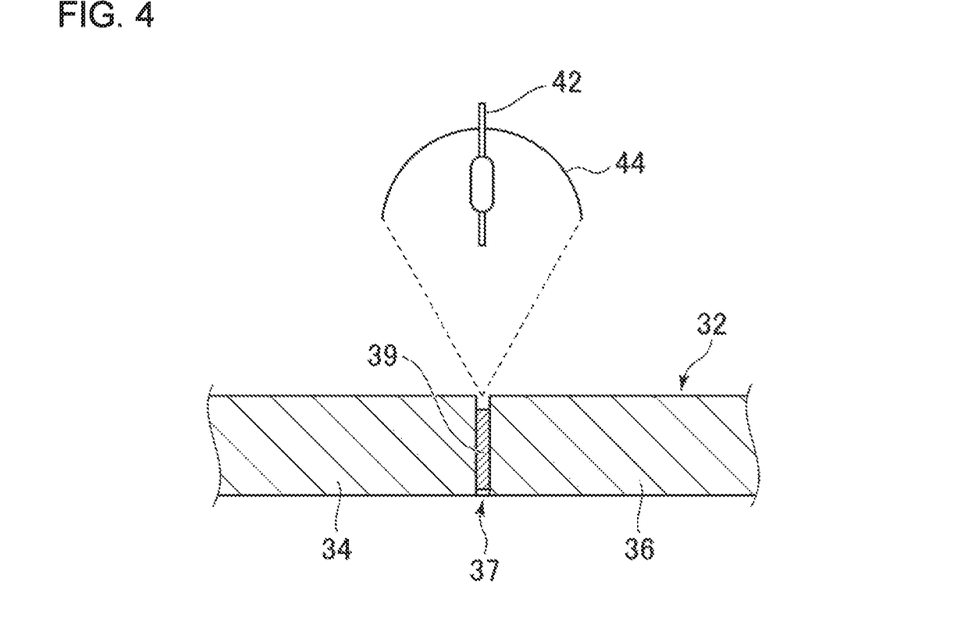
FIG. 4 is a cross-sectional view schematically illustrating an apparatus manufacturing the ring for the electrode.

In the present embodiment, an apparatus illustrated in FIG. 4 can be used. The apparatus illustrated in the figure includes at least one lamp 42 and at least one elliptical mirror 44 as a light condensing portion that condenses light emitted from the lamp 42. As the lamp 42, a xenon lamp or a halogen lamp that is commonly used in an infrared crystal growth apparatus is usable. An output of the lamp is preferably about 1 kW to about 30 kW.

The heating may be performed from an oblique direction without being limited to a direction perpendicular to the silicon members as long as the heating is performed from the outer side of the abutting surfaces 37. The alloying metal foil is first melted by the heating and a metal melt is generated. Next, the abutting surfaces 37 of the silicon members in contact with the metal melt are attacked by the metal melt, and a melt containing silicon is generated. It is considered that when the heating is stopped and temperature is lowered, the melt is solidified while forming an alloy phase containing a eutectic, and joining is completed. For example, in a case where an Al foil as the alloying metal foil is used, the silicon members can be sufficiently joined by heating up to about 800° C.

A light focused region normally has a diameter of about 10 mm to about 30 mm. The diameter of the light focused region is increased to about 30 mm to about 100 mm when a light emission position of the lamp 42 is out of position from a focal point of an elliptical mirror 44. The light focused region thus expanded makes it possible to expand a heated range. The light focused region is preferably moved to scan the entire top surface of the ring 32 for the electrode at the abutting surfaces 37, to effect heating.

Next, the melt containing silicon and the alloying metal is cooled and solidified to generate the joining part 39 containing a eutectic alloy. When the alloying metal is Al and is cooled up to about 577° C., the joining part 39 containing Al-silicon eutectic (12.2 atomic % Al) is generated. A cooling speed depends on the alloying metal to be used. In the case where Al as the alloying metal is used, the cooling speed is preferably controlled to 10 to 100° C./min. If the cooling speed is lower than the above-described lower limit value, a cooling time is lengthened and efficiency is low. If the cooling speed is higher than the above-described upper limit value, distortion tends to remain in the joining part 39. The cooling speed can be controlled by gradually reducing the output of heating means after melting of the alloying metal foil is completed, and stopping the heating when the temperature of the joining part 39 is estimated to be lower than melting temperature of the eutectic. Such control of the heating temperature can be performed based on a result of a measurement of relationship between power of the heating means and the temperature. The measurement is previously performed, for example, while a thermocouple having a shape similar to the silicon members to be actually pasted together is disposed between the silicon members.

Generation of the melt by the heating and generation of the joining part 39 containing the eutectic alloy by the cooling described above are preferably performed inside a chamber of argon atmosphere of 10 torr to 200 torr (about 1333 Pa to about 26664 Pa) in order to prevent oxidation of the alloying metal and silicon. It is also possible to prevent oxidation by decompression without using argon gas; however, this is not preferable because decompression causes evaporation of silicon and the inside of the chamber may be contaminated. Further, oxidation can be prevented by nitrogen gas; however, this is not preferable because silicon is nitrided at temperature of 1200° C. or more.

Next, the silicon adhesion parts 40 are described. One silicon adhesion part 40 between the abutting surfaces 37 of each two of the first silicon members 34, 36, and 38 is formed by heating and melting silicon near the abutting surfaces 37. First, expansion of the elliptical mirror 44 at the irradiation position is set to about 3 mm by adjusting a position of the lamp such that a focal position of an elliptical mirror 44 and a position of a light emitting unit of the lamp 42 are coincident with each other, and adjusting a height of the top surface of the silicon members so as to be coincident with another focal point of the elliptical mirror 44. In this state, the position of the elliptical mirror 44 is adjusted to the positions of the abutting surfaces 37, and power of the lamp 42 is increased. When heating is started, the surface side of the abutting surfaces 37 is melted to generate silicon melt. More specifically, the surface starts to melt at 60% of rated lamp power (estimated surface temperature is 1420° C.), and the silicon melt flows into the gap between the abutting surfaces 37 to plug a part of the gap between the abutting surfaces 37 at 90% of the rated lamp power. In this state, the elliptical mirror 44 is moved for scanning along the abutting surfaces 37 at a constant speed, for example, at a speed of 5 mm/min, which makes it possible to plug the gap between the abutting surfaces 37 with the silicon melt. The elliptical mirror 44 is preferably moved to scan the top surface side and the outer peripheral surface side of the ring 32 for the electrode out of the outer edges of the abutting surfaces 37, to effect heating.

Next, the surfaces of the melted abutting surfaces 37 are cooled to crystallize the silicon melt based on crystal of the silicon members. More specifically, the power of the lamp 42 is reduced, in two minutes, to 55% of the rated lamp power at which the silicon melt starts to be solidified, and the state is maintained for five minutes.

The joining parts 39 and the silicon adhesion parts 40 are similarly formed at all of the abutting surfaces 37 through the above-described procedure, which makes it possible to join the first silicon members 34, 36, and 38 to form the ring 32 for the electrode.

The ring 32 for the electrode obtained in the above-described manner may serve as the focus ring 18 by being provided with the concave part over the entire inner circumference by machining.

The ring 32 for the electrode is manufacturable by combining three or more silicon members that are each cut out from a silicon crystal ingot for wafer having a size smaller than the outer diameter of the focus ring 18. Accordingly, it is unnecessary for the ring 32 for the electrode to use the silicon crystal ingot for wafer that has a size larger than the outer diameter of the focus ring 18, which allows for reduction of the cost.

Since the ring 32 for the electrode according to the present embodiment includes the silicon adhesion parts 40 at the abutting surfaces 37, it is possible to prevent the eutectic alloy at the joining parts 39 from being exposed. Accordingly, even when the ring 32 for the electrode is to be irradiated with plasma inside the vacuum chamber 12, it is possible to prevent the inside of the vacuum chamber 12 from being contaminated by the eutectic alloy.

2. Second Embodiment

Next, a ring for an electrode according to a second embodiment is described. Note that components similar to the components according to the above-described first embodiment are denoted by like reference numerals, and description thereof is omitted. A ring 46 for an electrode illustrated in FIG. 5 includes the first ring body 32 and a second ring body 47. The first ring body 32 is the same as the ring for the electrode according to the above-described first embodiment. The second ring body 47 includes a plurality of (three in the figure) second silicon members 48, 50, and 52. Although the reference numerals are different for convenience of description, the second silicon members 48, 50, and 52 are the same as the first silicon members 34, 36, and 38. The first ring body 32 and the second ring body 47 are coaxially superposed through joining surfaces 54 while abutting surfaces 37 of the silicon members of the first ring body 32 are out of position in a circumferential direction from abutting surfaces 37 of the silicon members of the second ring body 47.

Figure 6A:
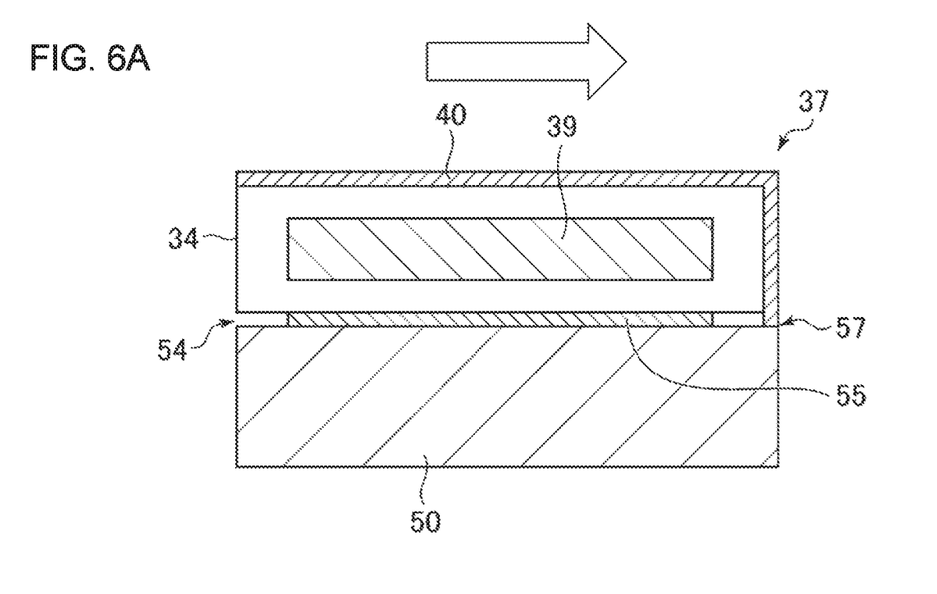
Figure 6B:
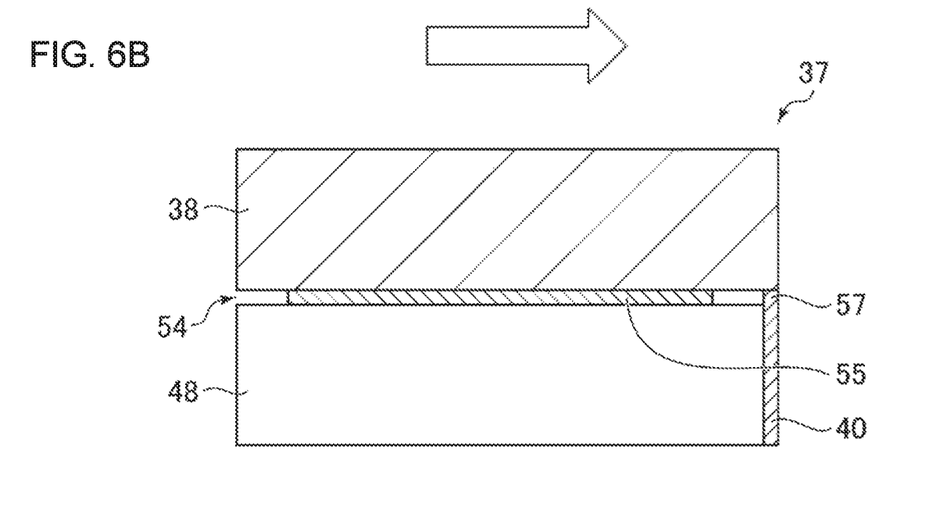
FIG. 6B is a cross-sectional view illustrating an abutting surface according to a second embodiment, where

As illustrated in FIGS. 6A and 6B, the joining part 39 and the silicon adhesion part 40 are provided between the abutting surfaces 37 of each two of the first silicon members 34, 36, and 38. FIG. 6A illustrates the abutting surface 37 between the first silicon members 34 and 36, and FIG. 6B illustrates the abutting surface 37 between the second silicon members 48 and 52. A direction of an arrow in the figure indicates an outside direction in a radial direction of the ring 46 for the electrode. Each of the joining parts 39 is provided at a center part except for a range of several mm from the outer edges of the abutting surfaces 37, and is preferably provided at the center part except for a range of 1 mm or more from the outer edges of the abutting surfaces 37. Further, a joining part 55 is also provided between the joining surface 54 of the first ring body 32 and the joining surface 54 of the second ring body 47. Note that the joining part 39 may be provided between the abutting surfaces 37 of each two of the second silicon members 48, 50, and 52.

The silicon adhesion parts 40 are provided on the outer edges of the abutting surfaces 37 and on the outer edges of the joining surfaces 54 of the first ring body 32 and the second ring body 47. The silicon adhesion parts 40 are preferably provided at parts that are not in contact with the wafer 22 and the base 16 and are exposed inside the vacuum chamber 12, namely, on the top surface side and the outer peripheral surface side of the ring 46 for the electrode. More specifically, the silicon adhesion parts 40 are preferably provided on the top surface side and the outer peripheral surface side of the ring 46 for the electrode out of the outer edges of the abutting surfaces 37 of the first ring body 32, on the outer peripheral surface side of the ring 46 for the electrode out of the outer edges of the abutting surfaces 37 of the second ring body 47, and on outer peripheral surface side 57 of the ring 46 for the electrode out of the outer edges of the joining surfaces 54.

As described above, each of the silicon adhesion parts 40 plugs the gap between the abutting surfaces 37 of each two of the first silicon members 34, 36, and 38 and the second silicon members 48, 50, and 52, and the gap between the joining surface 54 of the first ring body 32 and the joining surface 54 of the second ring body 47.

Figure 5:
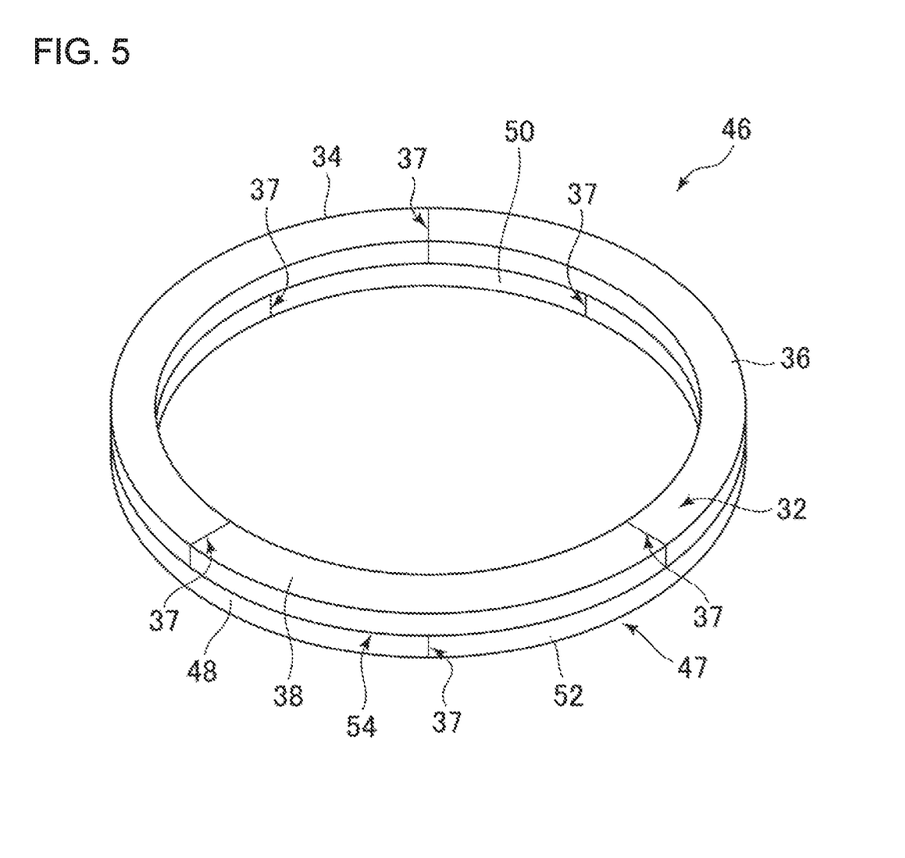
FIG. 5 is a perspective view illustrating a ring for an electrode according to a second embodiment.

Next, a method of manufacturing the ring 46 for the electrode according to the present embodiment is described. Note that description of steps similar to the steps according to the above-described first embodiment is appropriately omitted. First, the three surface-treated second silicon members 48, 50, and 52 are arranged in the ring shape. Next, an alloying metal foil is disposed on the surfaces of the second silicon members 48, 50, and 52. Subsequently, the three first silicon members 34, 36, and 38 are placed on the alloying metal foil. The alloying metal foil is disposed between each two of the three silicon members 34, 36, and 38. The first silicon members 34, 36, and 38 are disposed so as to be out of position, by half of a length in a longitudinal direction, from the second silicon members 48, 50, and 52 that have been already disposed. The first silicon members 34, 36, and 38 are stacked on the second silicon members 48, 50, and 52 through the alloying metal foil in the above-described manner.

Next, heating is performed from the first silicon members 34, 36, and 38 side, to generate a melt containing silicon and the alloying metal between the first ring body 32 and the second ring body 47 and between the abutting surfaces 37 of each two of the first silicon members 34, 36, and 38, thereby forming the joining parts 39 and 55. The heating condition and the cooling condition similar to the heating condition and the cooling condition according to the above-described first embodiment are adoptable.

Next, the silicon between the abutting surfaces 37 of each of the first ring body 32 and the second ring body 47 and the silicon between the joining surfaces 54 are heated and melted to form the silicon adhesion parts 40.

Since the ring 46 for the electrode according to the present embodiment includes the silicon adhesion parts 40 between the abutting surfaces 37 and between the joining surfaces 54, it is possible to achieve effects similar to the effects by the above-described first embodiment.

3. Third Embodiment

Next, a ring for an electrode according to a third embodiment is described. A ring 56 for an electrode illustrated in FIGS. 7A and 7B includes a plurality of (three in this figure) first silicon members 58, 60, and 62, and a plurality of (three) embedded silicon members 64A that is each embedded at a position across each two of the first silicon members 58, 60, and 62. The embedded silicon members 64A are provided on side opposite to the side to be irradiated with plasma, of the ring 56 for the electrode. In this figure, the embedded silicon members 64A are provided on rear surface side.

Figure 7A:
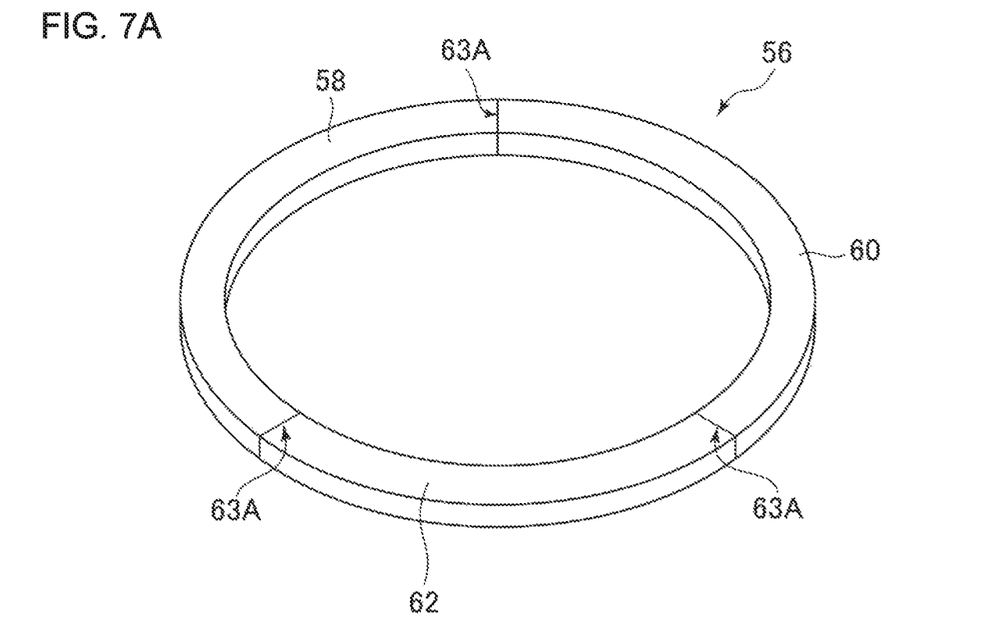
Figure 7B:
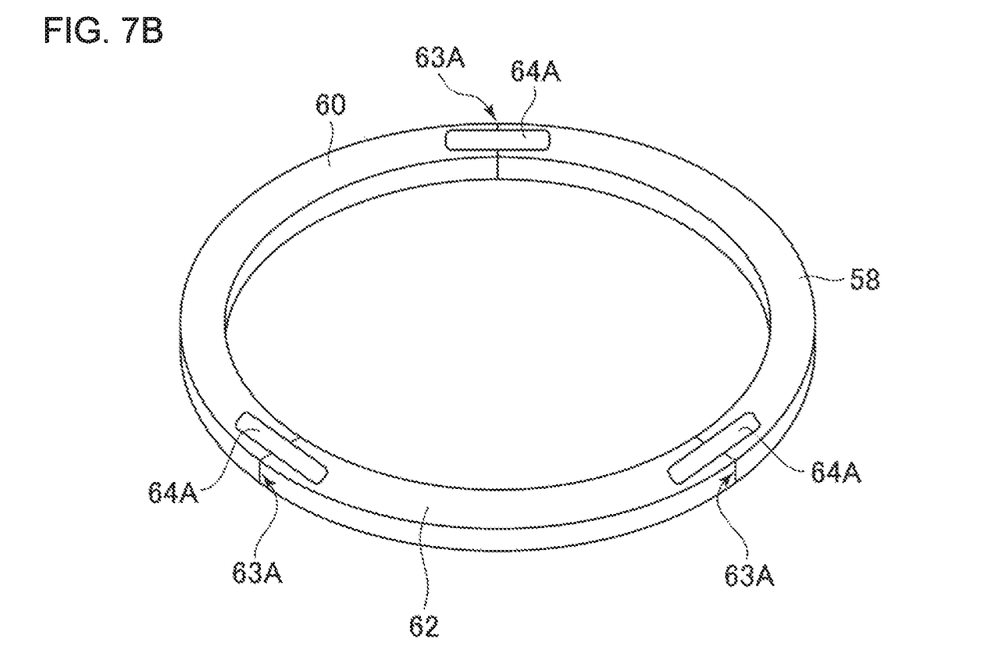

The embedded silicon members 64A are preferably made of the same material as the material of the silicon members. Four corners of each of the embedded silicon members 64A are preferably subjected to round chamfering. The four corners of each of the embedded silicon members 64A are subjected to the round chamfering, which makes it possible to prevent damage such as chipping. A radius of the round chamfering is preferably 3 mm or more.

The embedded silicon members 64A are preferably formed such that bottom surfaces thereof are substantially flush with the rear surfaces of the silicon members. A thickness of each of the embedded silicon members 64A is preferably 20% to 80% of the thickness of the silicon members, and is more preferably 40% to 60%.

Each of the embedded silicon members 64A is preferably formed of a rectangular plate member, and preferably has a size not protruding from the ring 56 for the electrode in a planar view. A length in the longitudinal direction of each of the embedded silicon members 64A is preferably 2% to 10% of an outer peripheral length of the ring 56 for the electrode.

More specifically, the size of each of the silicon members can be set to the size obtained by dividing a ring that has an inner peripheral diameter of 296 mm, an outer peripheral diameter of 380 mm, and a thickness of 4 mm, into three pieces. Each of the embedded silicon members 64A can be set to a length of 60 mm, a width of 25 mm, and a thickness of 2 mm, and have the four corners subjected to the round chamfering of 5 mm. Each of holes provided on the rear surfaces of the silicon members has a shape corresponding to a shape of a small silicon piece and has a depth of 2 mm. In this case, the thickness of each of the embedded silicon members 64A is 50% of the thickness of each of the silicon members, and the length in the longitudinal direction of each of the embedded silicon members 64A is 5% of the outer peripheral length of the ring 56 for the electrode.

Figure 8:
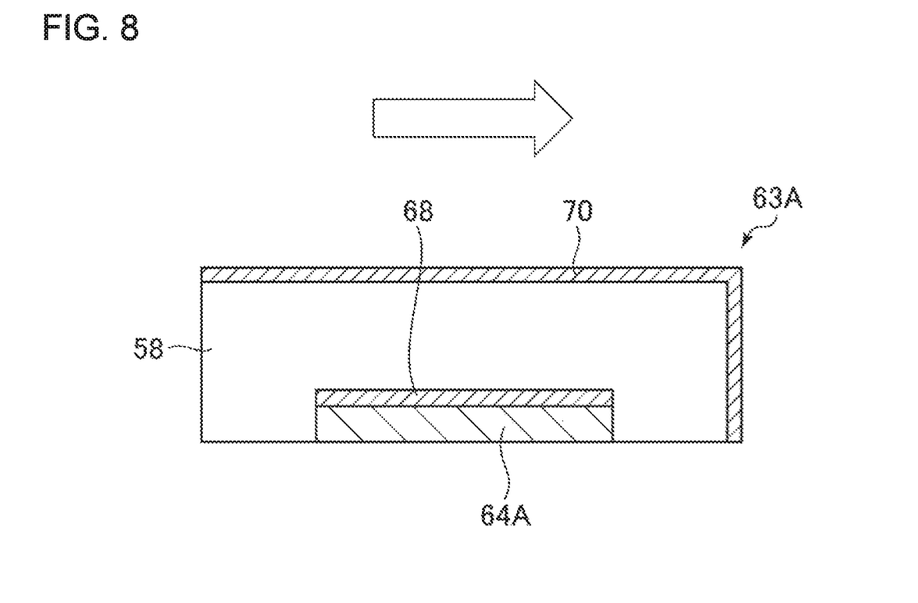
FIG. 8 is a cross-sectional view illustrating an abutting surface according to the third embodiment.

As illustrated in FIG. 8, the holes each having a bottom surface are provided at end parts in the longitudinal direction of each of the silicon members, on the rear surfaces of the silicon members. FIG. 8 illustrates an abutting surface 63A of the first silicon member 58 between the first silicon members 58 and 60. A direction of an arrow in the figure indicates an outside direction in a radial direction of the ring 56 for the electrode. The embedded silicon members 64A are embedded in the holes. A joining part 68 is provided between a top surface of each of the embedded silicon members 64A and the corresponding first silicon members (bottom surface of hole). A silicon adhesion part 70 is preferably provided between the abutting surfaces 63A of each two of the first silicon members 58, 60, and 62. The silicon adhesion parts 70 are preferably provided on the top surface side and the outer peripheral side of the ring 56 for the electrode out of the outer edges of the abutting surfaces 63A.

In the ring 56 for the electrode according to the present embodiment, heating is performed from the top surface side of the silicon members to generate a melt containing silicon and the alloying metal, thereby forming the joining parts 68. Further, the silicon adhesion parts 70 at the abutting surfaces 63A can be formed by a method similar to the method according to the above-described first embodiment.

In the ring 56 for the electrode according to the present embodiment, the joining surface area between the silicon members can be increased because the embedded silicon members 64A are provided. This makes it possible to more increase mechanical strength. Further, the ring 56 for the electrode can achieve effects similar to the effects according to the above-described first embodiment because each gap between the abutting surfaces 63A is plugged with the silicon adhesion part 70.

Figure 9A:
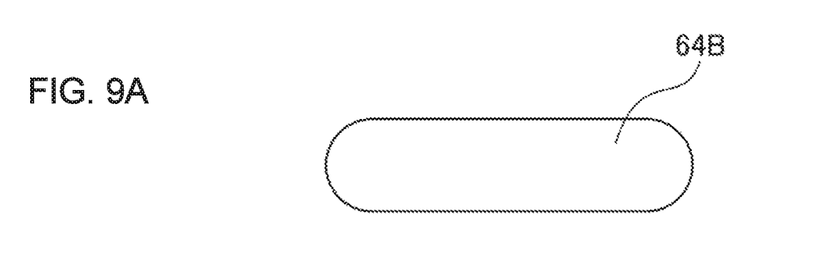
FIG. 9A is a plan view illustrating an embedded silicon member, where
Figure 9B:
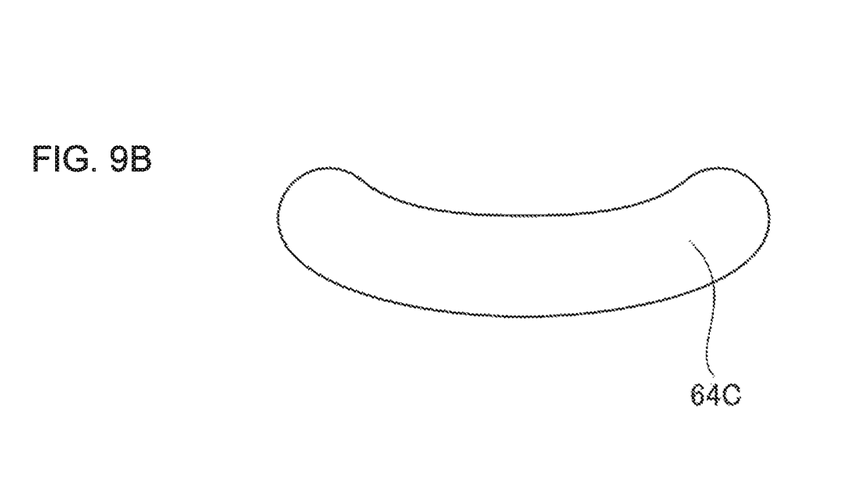
FIG. 9B is a plan view illustrating an embedded silicon member, where

Each of the embedded silicon members 64A is not necessarily formed in the rectangular shape. Alternatively, for example, as illustrated in FIGS. 9A and 9B, an embedded silicon member 64B having a long-circle shape (FIG. 9A) or an embedded silicon member 64C having an arc shape (FIG. 9B) may be used. Further, each of end parts in the longitudinal direction of each of the embedded silicon members 64B and 64C may be a semi-circular shape as illustrated in the same figure.

Figure 10A:
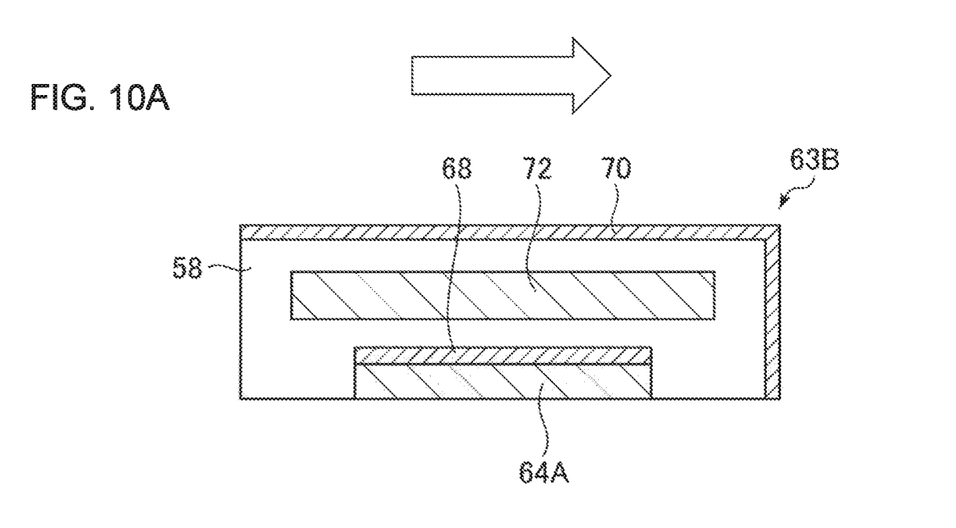
FIG. 10A is a cross-sectional view illustrating modifications of the abutting surface according to the third embodiment, where

The case where each of the joining parts 68 is provided between each of the embedded silicon members 64A and the corresponding silicon members (bottom surface of hole) has been described in the present embodiment; however, the present invention is not limited thereto. As illustrated in FIG. 10A, a joining part 72 may be additionally provided between the abutting surfaces 63B of the silicon members.

Figure 10B:
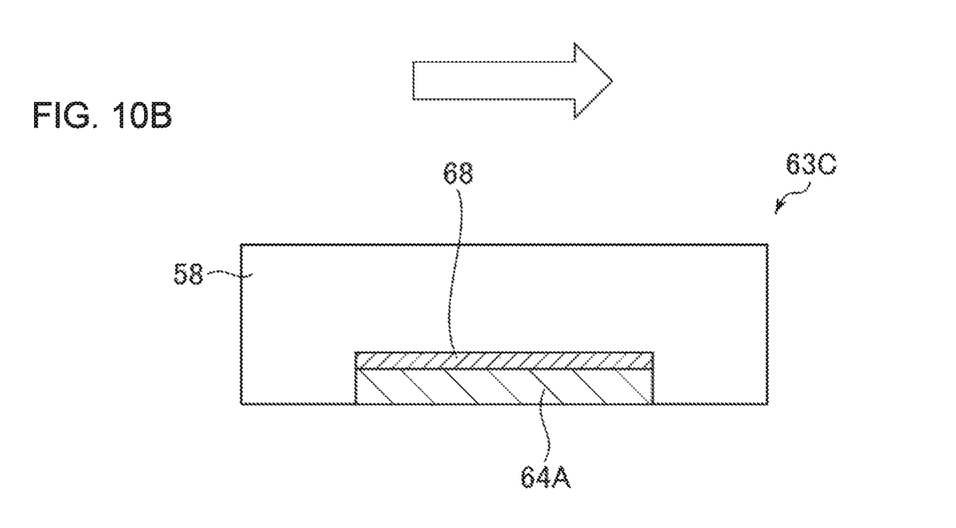
FIG. 10B is a cross-sectional view illustrating modifications of the abutting surface according to the third embodiment, where

The case where the silicon adhesion parts 70 are provided between the abutting surfaces 63A of each two of the first silicon members 58, 60, and 62 has been described in the present embodiment; however, the present invention is not limited thereto. As illustrated in FIG. 10B, no silicon adhesion part is provided between the abutting surfaces 63C.

4. Modification

The present invention is not limited to the above-described embodiment, and can be appropriately modified within the scope of the present invention.

In the above-described embodiment, the case where the joining part contains the alloying metal has been described; however, the present invention is not limited thereto, and the joining part may contain boron oxide. A method of manufacturing the ring for the electrode in the case where the joining part contains boron oxide is described below with the example of the joining surfaces.

First, three surface-treated silicon members are arranged in a ring shape in a manner similar to the above-described embodiment. Subsequently, the silicon members are heated to first temperature (180° C. to 280° C.), and a starting material made of particulate boric acid ($B(OH)_3$) is supplied to at least a part of the joining surfaces of the silicon members. The silicon members can be heated by heating means using a common electric resistance heater. Since the temperature of the joining surfaces is 180° C. to 280° C., dehydration reaction of boric acid occurs on the joining surfaces. Water is desorbed from boric acid in about 10 seconds to about 60 seconds, and metaboric acid ($HBO_2$) is accordingly generated. Metaboric acid is dissolved into the desorbed water to generate a liquid substance having excellent fluidity.

In a case where the temperature of the silicon members is excessively low, water cannot be desorbed from boric acid, and metaboric acid cannot be obtained. In contrast, in a case where the temperature of the silicon members is excessively high, water is quickly desorbed from boric acid. As a result, boric acid supplied to the joining surfaces of the silicon members may be splattered or boric acid may be quickly solidified. When the first temperature is 180° C. to 280° C., it is possible to more surely obtain metaboric acid. The first temperature is preferably 200° C. to 240° C.

As the starting material made of particulate boric acid, granular boric acid having a diameter of 0.1 mm to 2 mm sold on the open market can be used as it is. When the starting material made of boric acid having a diameter of 0.1 mm to 2 mm is supplied to the surfaces of the silicon members heated to the first temperature, it is possible to form a layer containing metaboric acid described later. Boric acid is preferably supplied little by little to a part of the surfaces of the silicon members.

The liquid substance that has been generated through desorption of water from boric acid is spread by a spatula to form the layer containing metaboric acid. As described above, boric acid as the starting material is supplied little by little to the joining surfaces of the silicon members, and the generated liquid substance is spread every time. As a result, it is possible to form the uniform layer containing metaboric acid on the joining surfaces. A cut wafer is used as the spatula, which makes it possible to avoid mixture of impurity into the layer containing metaboric acid.

A thickness of the layer containing metaboric acid is preferably 1 mm or less, and more preferably 0.1 mm to 0.5 mm. Generation of bubbles caused by dehydration reaction can be suppressed when heating is performed in a subsequent step as the thickness of the layer containing metaboric acid is smaller. The thickness of the layer containing metaboric acid can be adjusted by controlling an amount of boric acid to be supplied as the starting material.

The silicon members that have been provided with the layer containing metaboric acid on the joining surfaces are heated to increase its temperature to second temperature (500° C. to 700° C.). As a result, water is further desorbed from metaboric acid, and a melt containing boron oxide ($B_2O_3$) is accordingly generated. In a case where the second temperature is excessively high, the silicon members may be cracked due to difference of thermal expansion coefficients between boron oxide and silicon when cooling is performed in a subsequent step. In the case where the second temperature is 500° C. to 700° C., it is possible to more surely obtain the melt containing boron oxide. The second temperature is preferably 550° C. to 600° C.

The other surface-treated silicon members are bonded by pressing on the melt containing boron oxide generated on a joining region of the silicon members. Pressure in press-bonding is not particularly limited, and is appropriately settable. In a case where a width of each of the silicon members is about 30 mm, the silicon members and the other silicon members can be joined with a heat insulating material in between by pressing with hands.

When the melt of boron oxide is solidified, the silicon members and the other silicon members are joined to each other by the boron oxide layer. The melt is solidified, for example, when left at room temperature. The joining part is generated in the above-described manner to manufacture the ring for the electrode.

The layer containing metaboric acid may be formed not over the entire region of the joining surfaces of the silicon members but in a frame shape along an outer edge of the joining surfaces. The width of the frame-shaped layer containing metaboric acid can be 5 mm to 10 mm. The alloying metal foil is disposed in a region inside the frame-shaped layer containing metaboric acid. Before the alloying metal foil is disposed in the inside region, the frame-shaped layer containing metaboric acid may be cooled and the surface thereof may be polished to reduce the thickness. The frame-shaped layer containing metaboric acid is formed on the joining surfaces of the silicon members and the alloying metal foil is disposed. Thereafter, the other silicon members are disposed, and the silicon members and the other silicon members are heated to eutectic temperature or more and 700° C. or less. The alloying metal forms a eutectic with silicon by the heating, which makes it possible to more firmly join the silicon members to each other. The eutectic alloy formed at this time is surrounded by the frame-shaped boron oxide layer. Further providing the silicon bonding parts on the outer edges of the joining surfaces makes it possible to achieve effects similar to the effects by the above-described first embodiment.

The case where the silicon adhesion parts are provided on the top surface and the outer peripheral surface of the ring for the electrode to be irradiated with plasma has been described; however, the present invention is not limited thereto, and the silicon adhesion parts may be provided on entire circumferences of the outer edges of the abutting surfaces. Further, in the case of the above-described second embodiment, the silicon adhesion parts may be provided on inner peripheral edges in addition to the outer peripheral edges of the joining surfaces.

REFERENCE SIGNS LIST

10 Dry etching apparatus (substrate treatment apparatus)
12 Vacuum chamber (treatment chamber)
32, 46, 56 Ring for electrode
34, 36, 38, 58, 60, 62 First silicon member
37 Abutting surface
39, 55, 68, 72 Joining part
40, 70 Silicon adhesion part
48, 50, 52 Second silicon member
54 Joining surface
63A, 63B, 63CA butting surface
64A, 64B, 64C Embedded silicon member

The invention claimed is:
1. A ring for an electrode comprising:
  a plurality of first silicon members abutted in one direction, the plurality of first silicon members including one silicon member and another silicon member, wherein each of the one silicon member and the another silicon member has an arc shape and has an upper surface and a rear surface, and has a hole having a bottom surface at an end part in a longitudinal direction on the rear surface;
  an embedded silicon member that is embedded at a position across the one silicon member and the another silicon member abutting the one silicon member, wherein the embedded silicon member is a plate member, and is embedded in the hole of the one silicon member and the hole of the another silicon member; and
  a joining part joining the one silicon member, the another silicon member, and the embedded silicon member, wherein the joining part is provided between the bottom surface of the hole of the one silicon member and a top surface of the embedded silicon member and between the bottom surface of the hole of the another silicon member and the top surface of the embedded silicon member.

2. The ring for the electrode according to claim 1, further comprising a silicon adhesion part plugging a gap between the plurality of first silicon members.

3. The ring for the electrode according to claim 1, wherein the joining part contains any of Al, Ga, Ge, and Sn, forming a eutectic alloy with silicon.

4. The ring for the electrode according to claim 1, wherein the joining part is a boron oxide layer.

5. The ring for the electrode according to claim 4, wherein the joining part contains any of Al, Ga, Ge, and Sn, forming a eutectic alloy with silicon.

6. The ring for the electrode according to claim 1, wherein the plate member comprises a rectangular plate member having four rounded chamfered corners.

7. The ring for the electrode according to claim 1, wherein the embedded silicon member has a long-circle shape or an arc shape.

8. A substrate treatment apparatus configured to perform plasma treatment on a substrate comprising:
  the ring for the electrode according to claim 1;
  a treatment chamber configured to install the ring for the electrode;
  wherein the embedded silicon member is provided on a side of the ring for the electrode opposite to a side to be irradiated with plasma during the plasma treatment within the treatment chamber.

9. The ring for the electrode according to claim 1, wherein the bottom surface of hole of the one silicon member is substantially parallel to the rear surface of the one silicon member.

10. The ring for the electrode according to claim 9, wherein a bottom surface of the embedded silicon member is substantially parallel to the bottom surface of the hole of the one silicon member and the rear surface of the one silicon member, further wherein the bottom surface of the embedded silicon member is flush with rear surface of the one silicon member.

11. The ring for the electrode according to claim 6, wherein the rounded chamfered corners comprise a radius that is 3 mm or more.

12. The ring for the electrode according to claim 1, wherein the embedded silicon member embedded in the hole of the one silicon member is surrounded by the one silicon member.

* * * * *